United States Patent [19]

Akamatsu

[11] 3,879,620

[45] Apr. 22, 1975

[54] DC POWER CONTROL SYSTEM

[75] Inventor: Masahiko Akamatsu, Amagasaki, Japan

[73] Assignee: Mitsubishi Denki Kabushiki Kaisha, Tokyo, Japan

[22] Filed: Apr. 23, 1973

[21] Appl. No.: 353,678

Related U.S. Application Data

[63] Continuation of Ser. No. 127,104, March 23, 1971, abandoned.

[30] Foreign Application Priority Data

Mar. 24, 1970 Japan ................................ 45-24613

[52] U.S. Cl.......... 307/252 M; 307/250; 307/252 A; 307/252 K

[51] Int. Cl. ........................................... H03k 17/72

[58] Field of Search.... 307/240, 250, 252 A, 252 K, 307/252 M; 323/225 C

[56] References Cited

UNITED STATES PATENTS

| | | | |
|---|---|---|---|
| 3,360,712 | 12/1967 | Morgan | 307/252 M |
| 3,365,640 | 1/1968 | Gurwicz | 307/252 M |
| 3,431,436 | 3/1969 | King | 307/240 |
| 3,614,586 | 10/1971 | King | 307/252 M |

*Primary Examiner*—John Zazworsky
*Attorney, Agent, or Firm*—Robert E. Burns; Emmanuel J. Lobato; Bruce L. Adams

[57] ABSTRACT

A d.c. power control system having an inverted series combination of a reverse conduction main thyristor and a flywheel diode connected in parallel with a d.c. power source, a commutation inductance connected to an electrical shunt path for the reverse conduction thyristor or to an electrical path between the flywheel diode and the reverse conduction thyristor, and a commutation capacitor connected in parallel with an electrical path between the commutation inductance and the reverse conduction thyristor.

15 Claims, 14 Drawing Figures

DC POWER CONTROL SYSTEM

This is a continuation, of application Ser. No. 127,104, filed Mar. 23, 1971, now abandoned.

This invention relates to a d.c. power control system, and more particularly, to a d.c. power control system comprising a commutator employing thyristors.

One object of the present invention is to provide an improved commutator simple in construction.

Another object of the invention is to provide a commutator wherein the voltage increase of a commutation capacitor and therefore the increase in the blocking voltage for a commutation thyristor are reduced to be small.

Still another object of the invention is to provide a simple commutator wherein reverse conduction thyristors are effectively utilized.

Furthermore another object of the invention is to provide a small-sized commutator wherein the effective utilization rate of the commutator such as the commutation capacitor is improved to provide a commutator of high performance exhibiting a higher frequency and a larger capacity.

BRIEF DESCRIPTION OF THE DRAWING

The invention will become more readily apparent from the following detailed description taken in conjunction with the accompanying drawing in which.

Throughout the several Figures of the drawings the same reference characters designate the identical or corresponding components.

DESCRIPTION OF THE PREFERRED EMBODIMENT

Figure 1:
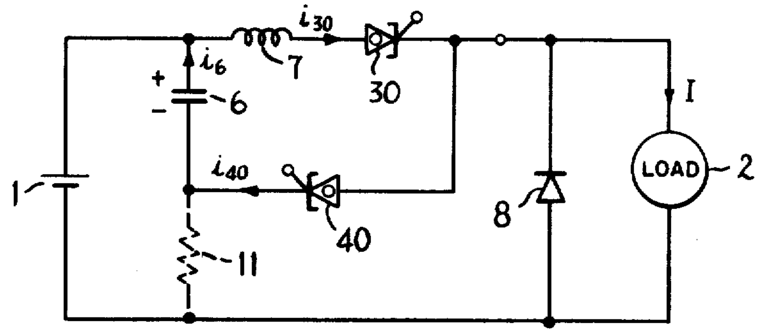
FIG. 1 is a circuit diagram of one embodiment of a d.c. power control system constructed in accordance with the present invention.

Referring now to FIG. 1, wherein a circuit diagram of one embodiment of a d.c. power control system constructed in accordance with the teachings of the present invention is illustrated, it is seen that the system comprises a d.c. power source 1 for energizing a load 2 and a flywheel diode 8 connected in parallel with the load 2. A parallel circuit composed of two series circuits which are a combination of a commutation inductive linear reactor 7 and a main reverse conduction thyristor 30 and a combination of a capacitor 6 and a commutation reverse conduction thyristor 40 respectively is connected in series between the source 1 and the flywheel diode 8. An auxiliary charging resistor 11 illustrated by a broken line may be connected at a junction between the capacitor 6 and the thyristor 40 and the source 1 for a purpose which will become apparent later.

Figure 9A:
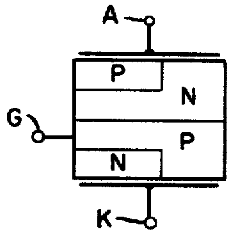
FIGS. 9*a*, *b* and *c* are schematic diagrams of structures of the reverse conduction thyristors for use in a d.c. power control system of the present invention.
Figure 9B:
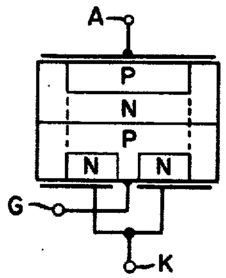
Figure 9C:
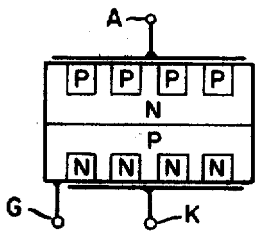

The term "reverse conduction thyristor" used herein refers to one kind of three-terminal thyristors with a control electrode of such the structure as illustrated in FIGS. 9*a* to *c*. These reverse conduction thyristors can be considered to be equivalents to those devices wherein a three-terminal thyristor of conventional design is provided with a diode connected in inverted parallel relationship. More specifically, the device comprises a PNPN four-layer region and a PN two-layer region. This is deemed that the conventional thyristor is provided on its cathode and anode sides with a shortcircuiting emitter region. This four-layer region provides a reverse current blocking and forward current conducting function. The ratio of these forward and reverse currents can be selected freely at will. For the d.c. power control device of the present invention, it is preferable to construct the main thyristor 30 so that is has a larger cross sectional area or volume of a four-layer region as compared with that of a two-layer region thereof and to construct the commutation thyristor 40 so that it has equal cross sectional area or volume of a four-layer region and a two-layer region.

Referring back to FIG. 1, the commutation capacitor 6 is charged so as to exhibit the illustrated polarity through the reverse conduction thyristor 40 which is for commutation. In case the load 2 is not connected to the source 1, the capacitor 6 can be charged also in the illustrated polarity through the auxiliary charging resistance 11 illustrated by a broken line.

Figure 2:
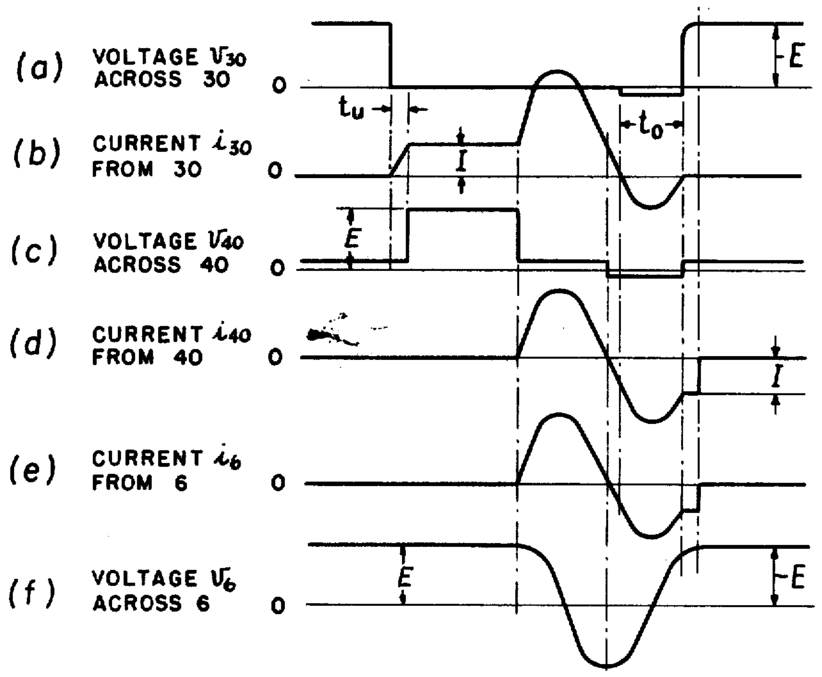
FIG. 2*a* to *f* inclusive are diagrams of operational waveforms of the embodiment shown in FIG. 1.

Then, when the main thyristor 30 is fired by a firing pulse supplied from a known pulse generator, not shown, a current begins to flow therethrough. The current, however, is controlled in its rise time to provide a period of time $t_u$ which is shown in FIG. 2*b* owing to the function of the commutation reactor 7 even when the current flows through the flywheel diode 8 without flowing through the load 2. At that point in time that the current flowing through the main thyristor 30 reaches the current value I of the load 2, the flywheel diode 8 turns off, whereupon the full load current is supplied to the load 2 through the main thyristor 30.

In order to turn off the main thyristor 30, the commutation thyristor 40 is fired by a firing pulse supplied from a pulse generator, not shown, then the energy charged in the commutation capacitor 6 discharges in a free vibration manner through an electrical path composed of the commutation reactor 7 — the main thyristor 30 — the commutation thyristor 40 in a forward direction. This is because the impedance of the load 2 is sufficiently high in comparison with the characteristic impedance which can be expressed by $\sqrt{L/C}$ between the commutation reactor 7 and the commutation capacitor 6. Therefore, the voltage of the commutation capacitor 6 can be inverted in polarity from the illustrated direction as seen in the curve of FIG. 2*f*. During the abovementioned period of vibration, the current flowing through the load 2 can be deemed to be substantially constant. Thus, this vibrating current superimposed to the load current I flows through the commutation reactor 7 and the main thyristor 30.

In succession to the above, the commutation capacitor 6 changes and is in a negative half cycle during which the capacitor 6 discharges its energy in the inversed direction of the commutation thyristor 40. Thus, during this negative half cycle, the current flowing through the commutation reactor 7 and the main thyristor 30 decreases and inversed in polarity into the reverse direction. The period during which the main thyristor 30 is in the reverse current conduction state is that period that the negative half cycle vibration current $i_6$ which is also the current flowing through the commutation capacitor 6 exceeds the current value I for the load 2, and this period equals to the reverse bias turn-off time $t_o$ for the main thyristor 30.

After the reverse biasing period has been terminated, the main thyristor 30 is energized by the voltage from the commutation capacitor 6 of the illustrated polarity which is of comparatively low voltage relative to the voltage E from the source 1, because the main thyristor 30 has recovered in forward current blocking capability, and the commutation capacitor 6 is charged through the commutation thyristor 40 and through the load 2 by an amount of the voltage corresponding to the lacking charge of the commutation capacitor 6. At the point in time at which the charged voltage in the direction of the illustrated polarity reaches to the value of the source voltage E, the current flowing through the load 2 transfers to flow through the flywheel diode 8, resulting in blocking of the reverse current flowing through the commutation capacitor 6 and the commutation thyristor 40. Therefore, the commutation capacitor 6 can not be overcharged exceeding the source voltage E.

It is to be noted that the commutation reactor 7 is arranged to serve to depress the increase rate of the current upon turning off both the main thyristor 30 and the commutation thyristor 40 as well as to provide a vibration function as done in a commutation reactor previously described. Also, since the vibration for the commutation operation is directly performed at a series loop composed of the main thyristor 30 and the anode reactor or the commutation reactor 7, the resulting reverse biasing time period is most effective. Further, since all of the wiring inductances are connected in series to the closed vibration loop, the effect resulting therefrom can be perfectly compensated by previously determining the inductance of the commutation reactor to be small by an amount of the wiring inductance.

Furthermore, the use of the reverse conduction thyristor can remove an adverse effect that the reverse bias time reduces to about one half of the ideal value due to the wiring inductance of the electrical shunt path for the previously described commutation bypass diode 8. This ensures the commutator is highly simplified. In addition, since the inherent vibration period of the commutation vibration is shortened, the minimum conduction period which is nearly equal to the inherent period of both the commutation reactor 7 and the commutation capacitor 6 can also be shortened. On the other hand, for the requirement of the common control range, a high operational frequency is realized, allowing the whole d.c. power control system to be made small-sized and reduced in weight, resulting in a useful effect extending over the whole system.

Figure 3:
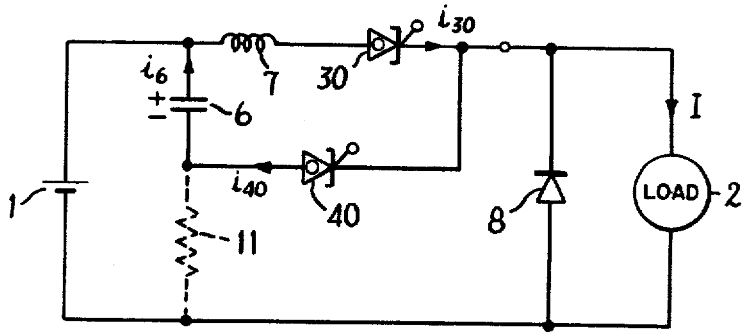
FIG. 3 is a circuit diagram of another embodiment of a d.c. power control system constructed according to the present invention.
Figure 4:
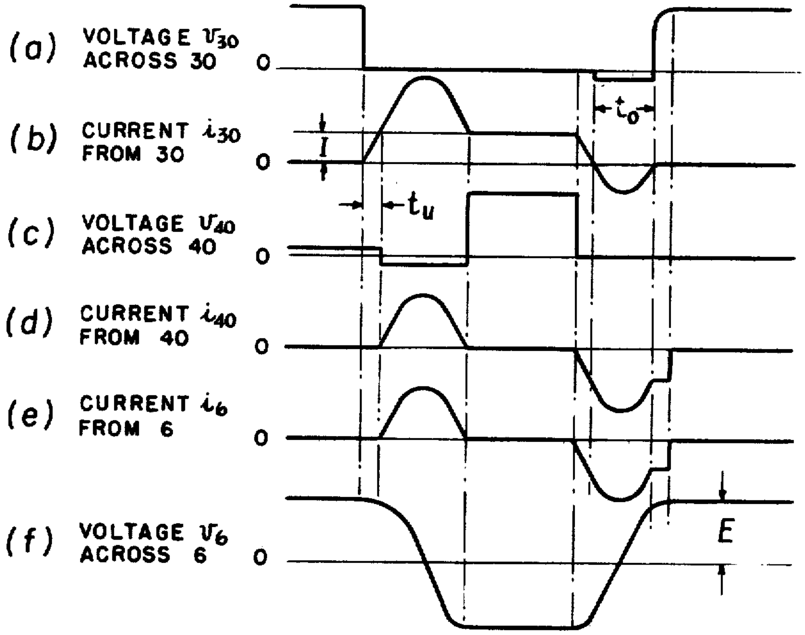
FIG. 4*a* to *f* inclusive are diagrams of operational waveforms of the embodiment shown in FIG. 3.

FIG. 3 shows the circuit diagram of another embodiment of the d.c. power control system constructed in accordance with the present invention. Comparing the circuit arrangement illustrated in FIG. 3 with that of FIG. 1, it is easily understood that the circuit is similar to that of FIG. 1 except that the commutation thyristor 40 is connected in opposite direction to that of the circuit arrangement shown in FIG. 1.

FIGS. 4*a* to *f* show the operational waveforms at the several circuit points of the circuit shown in FIG. 3.

The circuit arrangement illustrated in FIG. 3 operates as follows; In order to charge the commutation capacitor 6 to exhibit the polarity as illustrated, the commutation thyristor 30 is fired by a firing pulse from a pulse generator. When the main thyristor 30 is fired, the current flowing therethrough increases to reach to the current value I of the load 2 to place the flywheel diode 8 in a nonconductive state. Thereafter, the commutation capacitor 6 begins to vibrate through the commutation reactor 7 — the main thyristor 30 — the commutation thyristor in the reverse direction. By this positive half cycle vibration, the commutation thyristor 6 is charged in the polarity of the direction opposite to that illustrated.

The voltage charged in the commutation capacitor 6 in the opposite direction is applied to the commutation thyristor 40 in the forward direction to be prevented from flowing therethrough, whereas the current for the load 2 is permitted to continue to flow through the main thyristor 30.

When the commutation thyristor 40 is fired in order to turn off the main thyristor 30, the commutation capacitor 6 vibrates during the negative half cycle to turn off the main thyristor 30, thereby to complete the commutation operation similarly to the case of the circuit arrangement illustrated in FIG. 1.

As easily understood from the foregoing description, the circuit arrangement of FIG. 3 differs from the circuit arrangement of FIG. 1 only in terms that the positive half cycle vibration is previously performed. In other respects, the operation of the circuit illustrated in FIG. 3 is quite identical to that previously described in conjunction with FIG. 1. Therefore the effects obtained from both the circuits shown in FIGS. 3 and 1 are identical to each other.

Figure 5:
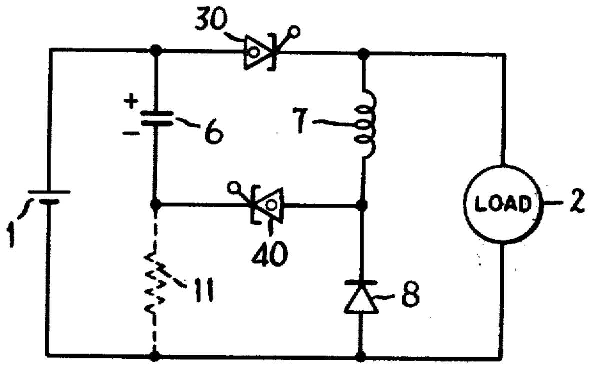
FIGS. 5 to 8 inclusive are circuit diagrams of the several embodiments of a d.c. power control system of the present invention.
Figure 6:
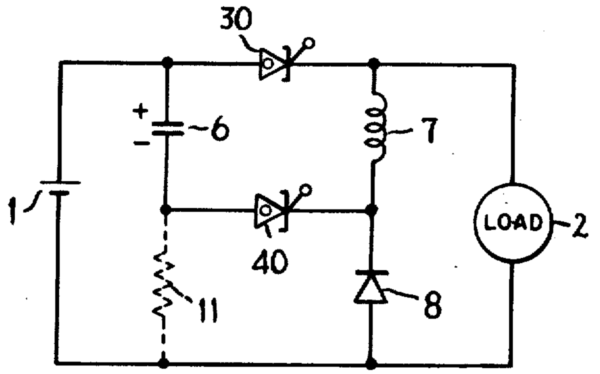

FIGS. 5 and 6 show the modified embodiments of the present invention. From FIG. 5, it is seen that the commutation reactor 7 is connected to the shunting path for the flywheel diode 8 in series to the same, and in other respects, the circuit is the same as that shown in FIG. 1. In FIG. 6, it is seen that the commutation reactor which is also connected to the shunting path for the flywheel diode 8 in series to the same. Therefore, the circuit arrangements illustrated in FIGS. 5 and 6 operate quite identical to those shown in FIGS. 1 and 3 respectively. Accordingly, the effects obtained from these circuit arrangements are identical to those from the circuit arrangements shown in FIGS. 1 and 3.

Figure 7:
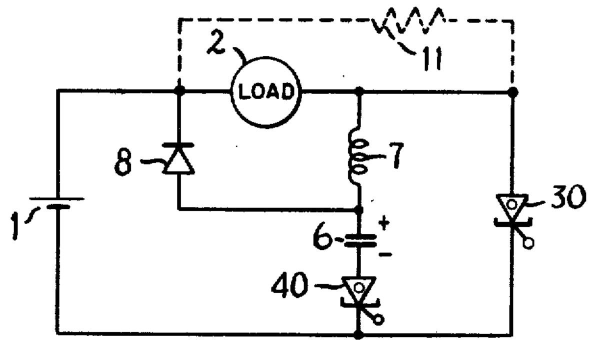
Figure 8:
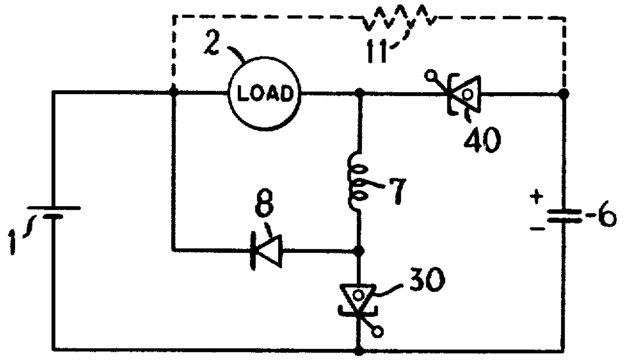

FIGS. 7 and 8 show the other modified embodiments of the d.c. power control system of the present invention. The circuit arrangement shown in FIG. 7 is similar to that shown in FIG. 5 except that the load 2 is connected to that side of the d.c. power source 1 exhibiting a positive polarity, while the circuit arrangement shown in FIG. 8 is similar to that shown in FIG. 6 except that the load 2 is also connected to that side of the d.c. power source 1 exhibiting a positive polarity.

As apparent from the detailed description of the operations of the various embodiments of the present invention, the main thyristor 30 is biased in reverse direction within the period during which the vibrating current between the commutation reactor 7 and the commutation capacitor 6 exceeds the current value I of the load 2. This reverse bias period for practical use, is selected to be one-half to two-thirds of the inherent cycle of the abovementioned vibration.

On the other hand, the commutation thyristor 40 permits a current to flow in the reverse direction only during the period of the inherent cycle of the abovementioned vibration in case of this embodiment. Also, with the embodiment shown in FIG. 3, the main thyristor 30 is biased in the reverse direction at least for the abovementioned vibration inherent cycle. In either embodiments, the reverse biase period of the commutation thyristor 40 is longer than that of the main thyristor 30. Therefore, the commutation thyristor 40 is not always required to be formed by a reverse conduction thyristor and, in stead, an inverted parallel diode may be connected outside of the thyristor. This arrangement can provides an equivalent reverse biasing period equal to that of the reverse conduction main thyristor 30 because, even though the wiring inductance is presented in the shunt path for the outer inverted parallel diode, the current flowing period of the inverted parallel diode is long enough as compared with the current flowing period of the main thyristor.

Figure 10A:
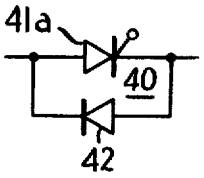
FIGS. 10*a*, *b* and *c* are connection diagrams showing improved or modified thyristor complexes which can substitute for reverse conduction thyristors for use in a d.c. power control system of the present invention.
Figure 10B:
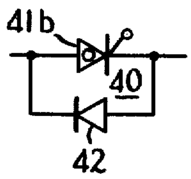
Figure 10C:
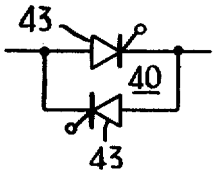

FIGS. 10*a* to *c* are circuit diagrams for showing some embodiments for use in place of the commutation thyristor 40 as just described. In FIG. 10*a*, the circuit arrangement to be used in place of the commutation thyristor 40 of the invention comprises a reverse blocking thyristor 41*a* and an inverted parallel diode 42 connected in inverted parallel relationship to the reverse blocking thyristor 41*a*. From FIG. 10*b*, it is seen that the circuit comprises a reverse conduction thyristor small in current flowing capacity through diode parts in the reverse conduction thyristor and the inverted parallel diode 42. FIG. 10*c* shows that the circuit comprises a pair of reverse blocking thyristors 43 connected in inverted parallel relationship to each other.

With the circuit arrangement shown in FIG. 10*a*, the circuit can be constructed to be less expensive and suitable for use with a high voltage through the use of the thyristor of widely used type. Also, the circuit can be improved in other respects such as in the forward blocking voltage, in the turn-off time or in the forward current in case of a low reverse blocking voltage is allowed through the use of the reverse blocking thyristor of a small reverse current blocking withstand voltage. With the circuit arrangement shown in FIG. 10*b*, there is provided a circuit wherein a reverse conduction thyristor for use as the main thyristor exhibiting a small proportion of the reverse current capacity is directly employed, thereby to strengthen the property with respect to the reverse direction current. Thus the circuit provides the effect that the employed thyristors throughout the system can be uniform throughout the system. With the circuit arrangement shown in FIG. 10*c*, high breakdown voltage blocking thyristors of widely used type can be used for both the positive and the negative elements.

It will be easily understood that the circuit formed by removing the commutation thyristor from the circuit arrangements heretofore described constitute a d.c. power control system capable of supplying an output having a constant pulse width.

Although, in some embodiments, the commutation capacitor is connected at its one terminal to one terminal of the d.c. power source, it is to be noted that the commutation capacitor may also be connected to the other terminal of the d.c. power source or to any desirable potential point of the circuit. For example, the commutation capacitor 6 shown in FIG. 1 may be connected at its one terminal labelled by the sign "+" to the negative terminal of the d.c. power source 1, or to the anode terminal of the flywheel diode 8. Even with such an arrangement, the only difference between the circuit and the embodiments heretofore described is that a d.c. bias voltage corresponding to the d.c. source voltage is added to the commutation capacitor, exhibiting quite the same operation and properties as those previously described. The circuit arrangement can remove the commutation reactor 7 by utilizing the inductances of the conductors from the power source.

As it has been heretofore described, according to the present invention there is provided a d.c. power control system comprising a reverse conduction main thyristor inserted into an electrical path for supplying an electric power from a d.c. power source to a load, a flywheel diode connected in series and oppositely poled to said reverse conduction main thyristor, a commutation inductance inserted into said electrical path, and a commutation capacitor connected in parallel with a series circuit including said reverse conduction main thyristor and said commutation inductance. With such a circuit arrangement of the d.c. power control system, several useful effects can be provided. For example, the commutator can be simple in construction, the commùtation capacitor can be prevented from being overcharged, an adverse effect to the reverse bias period for the anode reactor can be eliminated, and the anode reactor can be used in common with the commutation reactor or the current balancing reactor can be used in common with the commutation reactor.

What I claim is:

1. A controllable d.c. power system including a reverse conduction main thyristor having a forward blocking capability in a current path from a d.c. source to a load such that it can be rendered conducting in a forward direction by a triggering signal applied thereto, a flywheel diode connected in series and oppositely poled to said reverse conduction main thyristor, a commutation inductive linear reactor connected in said current path in series with said reverse conduction main thyristor, a commutation capacitor in parallel with a series circuit comprising said reverse conduction main thyristor and said commutation inductive linear reactor, commutation control means, means connecting said commutation control means and commutation capacitor in a second series circuit configuration in parallel with the first-mentioned series circuit, whereby said commutation capacitor and said commutation inductive linear reactor oscillate to turn off said reverse conduction main thyristor under control of said commutation control means.

2. A controllable d.c. power system according to claim 1, in which said commutation control means comprises a reverse conduction auxiliary thyristor.

3. A controllable d.c. power system according to claim 1, in which said commutation control means comprises an inverted parallel connection element comprising a reverse blocking thyristor and a diode connected in inverted parallel relationship with said reverse blocking thyristor.

4. A controllable d.c. power system according to claim 1, in which said commutation control means comprises an inverted parallel connection element comprising a pair of reverse blocking thyristors connected in inverted parallel relationship.

5. A controllable d.c. power system according to claim 1, in which said commutation control element comprises an inverted parallel connection element comprising a reverse conduction thyristor and an external diode connected in inverted parallel relationship with said reverse conduction thyristor.

6. A controllable d.c. power system including a reverse conduction main thyristor having a forward blocking capability in a current path from a d.c. source to a load such that it can be rendered conducting in a forward direction by a triggering signal applied thereto, a flywheel diode connected in series and oppositely poled to said reverse conduction main thyristor, a commutation inductive linear reactor connected between said flywheel diode and reverse conduction main thyristor in said current path in series with said reverse conduction main thyristor, a commutation capacitor in parallel with a series circuit comprising said reverse conduction main thyristor and said commutation inductive linear reactor, a commutation control element in series circuit configuration with said commutation capacitor and parallel with said series circuit, means connecting said commutation capacitor to an electrode of said reverse conduction main thyristor, means connecting said series circuit configuration between said commutation inductive linear reactor and said flywheel diode, whereby said commutation capacitor and said commutation inductive linear reactor oscillate to turn off said reverse conductive main thyristor.

7. A controllable d.c. power system according to claim 6, in which said commutation control element comprises a reverse conduction auxiliary thyristor.

8. A controllable d.c. power system according to claim 6, in which said commutation control element comprises an inverted parallel connection element comprising a reverse blocking thyristor and a diode connected in inverted parallel relationship with said reverse blocking thyristor.

9. A controllable d.c. power system according to claim 6, in which said commutation control element comprises an inverted parallel connection element comprising a pair of reverse blocking thyristors connected in inverted, parallel relationship.

10. A controllable d.c. power system according to claim 6, in which said commutation control element comprises an inverted parallel connection element comprising a reverse conduction thyristor and an external diode connected in inverted parallel relationship with said reverse conduction thyristor.

11. A controllable d.c. power system including a reverse conduction main thyristor having a forward blocking capability in a current path from a d.c. source to a load such that it can be rendered conducting in a forward direction by a triggering signal applied thereto, a flywheel diode connected in series and oppositely poled to said reverse conduction main thyristor, a commutation inductive linear reactor connected between said reverse conduction main thyristor and said load, a first series circuit composed of said commutation inductive linear reactor and said reverse conduction main thyristor, a second series circuit comprising a commutation capacitor and a commutation control element, means connecting said first and second series circuits in an oscillatory circuit, whereby said commutation capacitor and said commutation inductive reactor in said oscillatory circuit oscillate to turn off said reverse conduction main thyristor.

12. A controllable d.c. power system according to claim 11, in which said commutation control element comprises an inverted parallel connection element comprising a reverse blocking thyristor and a diode connected in inverted parallel relationship with said reverse blocking thyristor.

13. A controllable d.c. power system according to claim 11, in which said commutation control element comprises an inverted parallel connection element comprising a pair of reverse blocking thyristors connected in inverted, parallel relationship.

14. A controllable d.c. power system according to claim 11, in which said commutation control element comprises an inverted parallel connection element comprising a reverse conduction thyristor and an external diode connected in inverted parallel relationship with said reverse conduction thyristor.

15. A controllable d.c. power system according to claim 11, in which said commutation control element comprises a reverse conduction auxiliary thyristor.

* * * * *